United States Patent
Liu et al.

(10) Patent No.: US 10,879,076 B2
(45) Date of Patent: Dec. 29, 2020

(54) ETCHING SOLUTION FOR SELECTIVELY REMOVING SILICON-GERMANIUM ALLOY FROM A SILICON-GERMANIUM/SILICON STACK DURING MANUFACTURE OF A SEMICONDUCTOR DEVICE

(71) Applicant: Versum Materials US, LLC, Tempe, AZ (US)

(72) Inventors: Wen Dar Liu, Chupei (TW); Yi-Chia Lee, Chupei (TW); Andrew J. Adamczyk, Auburn, AL (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/108,499

(22) Filed: Aug. 22, 2018

(65) Prior Publication Data

US 2019/0088492 A1  Mar. 21, 2019

Related U.S. Application Data

(60) Provisional application No. 62/550,428, filed on Aug. 25, 2017.

(51) Int. Cl.
| | |
|---|---|
| *H01L 21/306* | (2006.01) |
| *C09K 13/06* | (2006.01) |
| *C09K 13/08* | (2006.01) |
| *H01L 21/02* | (2006.01) |

(52) U.S. Cl.
CPC ........ *H01L 21/30604* (2013.01); *C09K 13/06* (2013.01); *C09K 13/08* (2013.01); *H01L 21/0245* (2013.01); *H01L 21/02381* (2013.01); *H01L 21/02603* (2013.01)

(58) Field of Classification Search
None
See application file for complete search history.

(56) References Cited

U.S. PATENT DOCUMENTS

| | | | |
|---|---|---|---|
| 8,389,418 | B2 | 3/2013 | Epton et al. |
| 2005/0169096 | A1 | 8/2005 | Lee et al. |
| 2008/0146035 | A1 | 6/2008 | Kato et al. |
| 2008/0176385 | A1 | 7/2008 | Kato et al. |
| 2008/0194082 | A1 | 8/2008 | Kato et al. |
| 2016/0186105 | A1 | 6/2016 | Liu et al. |
| 2016/0343576 | A1* | 11/2016 | Bilodeau ........... H01L 21/32134 |
| 2017/0145311 | A1* | 5/2017 | Liu ......................... C09K 13/00 |
| 2018/0171226 | A1* | 6/2018 | Yang ..................... C09K 13/02 |

FOREIGN PATENT DOCUMENTS

| | | |
|---|---|---|
| CN | 101015043 | 8/2007 |
| EP | 1975987 A1 | 10/2008 |
| JP | 2008512862 | 4/2008 |
| KR | 20170034036 | 3/2017 |
| WO | 06027332 | 3/2006 |
| WO | 2017007893 A1 | 1/2017 |

* cited by examiner

*Primary Examiner* — Roberts P Culbert
(74) *Attorney, Agent, or Firm* — Anne B. Kiernan

(57) ABSTRACT

Described herein is an etching solution comprising water; oxidizer; water-miscible organic solvent; fluoride ion source; and optionally, surfactant. Such compositions are useful for the selective removal of silicon-germanium over poly silicon from a microelectronic device having such material(s) thereon during its manufacture.

22 Claims, 1 Drawing Sheet

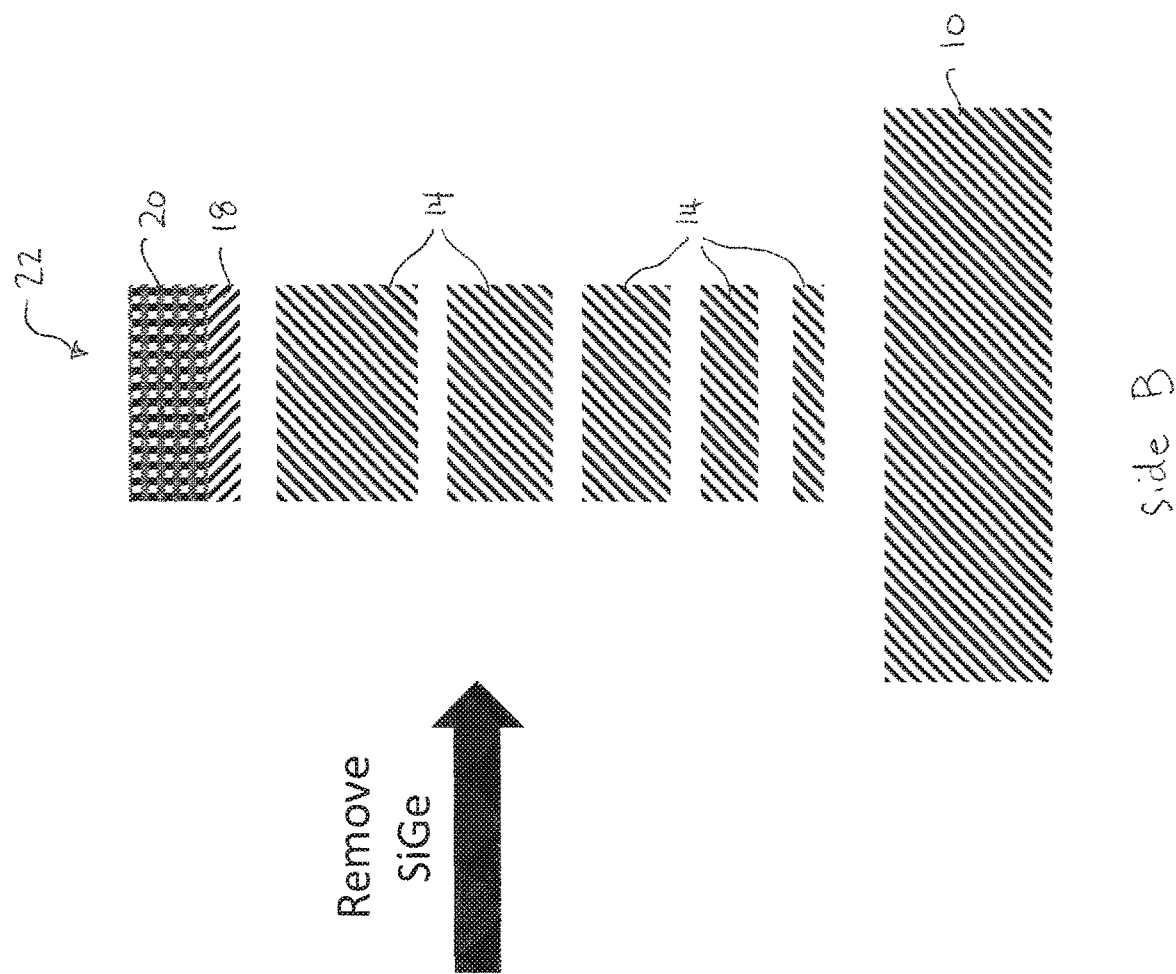
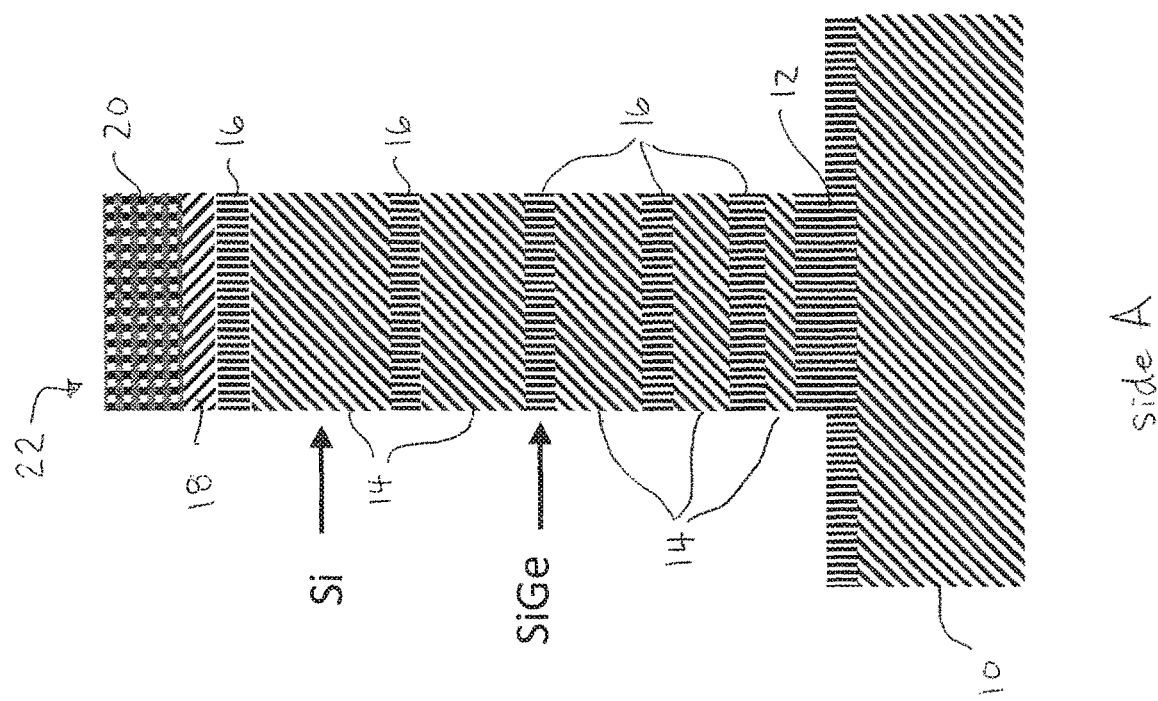

ETCHING SOLUTION FOR SELECTIVELY REMOVING SILICON-GERMANIUM ALLOY FROM A SILICON-GERMANIUM/SILICON STACK DURING MANUFACTURE OF A SEMICONDUCTOR DEVICE

CROSS REFERENCE TO RELATED APPLICATIONS

This application claims priority to U.S. provisional application 62/550,428 filed on Aug. 25, 2017, the entire contents of which is incorporated herein by reference thereto for all allowable purposes.

BACKGROUND OF THE INVENTION

The present invention relates to aqueous etching solutions used in the manufacture of semiconductor devices. More specifically, the invention provides an aqueous etching solution that exhibits increased etch selectivity of silicon-germanium alloy films over silicon dioxide films in silicon-germanium/silicon oxide composite semiconductor devices.

With constant down-scaling and increasingly demanding requirements to the speed and functionality of ultra-high density integrated circuits, conventional planar metal-oxide-semiconductor field effect transistors (MOSFETs) face increasing challenges with such issues as scaling of gate oxide thickness and electrostatic control of the gate electrode over the channel region. Fin field effect transistors (FinFETs) have exhibited improved control over a planar gate MOSFET design by wrapping the gate electrode over three sides of a fin-shaped channel.

GAA MOSFETs are similar to FinFETs but have the potential of even greater electrostatic control over the channel because the gate electrode completely surrounds the channel. In a GAA MOSFET, the channel region is essentially a nanowire. The nanowire channel typically has a thickness (or diameter) in the tens of nanometers (nm) or less and has an unconstrained length. The nanowire channel is suspended generally horizontally between, and anchored to, the much larger source and drain regions of the GAA MOSFET.

GAA MOSFETs can be fabricated on a bulk silicon substrate utilizing fully compatible CMOS technology. A typical manufacturing method of forming the channel regions in a GAA MOSFET involves epitaxially growing a stack (epi-stack) of sacrificial layers sandwiched between channel layers on top of a bulk substrate. The sacrificial layers and channel layers are composed of two different materials so that selective etching can remove the sacrificial layers.

By way of example, an epi-stack can be formed of alternating silicon (Si) and silicon germanium (SiGe) layers, wherein the SiGe layers are the sacrificial layers and the Si layers are the channel layers. The SiGe layers can then be removed by selective etching (for example via a wet etching process such as a hydrogen peroxide solution), which also inadvertently recesses trenches into the bulk substrate due to the similarity of materials composing the sacrificial layers and the substrate. Once the SiGe layers are removed, the Si layers can subsequently be formed into the nanowire channels suspended over the trenches. A thin gate dielectric is then disposed around the Si nanowire channels and over the recessed trenches of the substrate. Metal is then disposed over the dielectric to form the metal gate electrode of the GAA MOSFET.

Conventional wet chemical etching solutions for etching SiGe alloys typically employ an oxidizer and an oxide removal agent. The most common solutions are HF for silicon oxide etching and a solution of hydrogen peroxide ($H_2O_2$) and acetic acid ($CH_3COOH$) for SiGe oxidation. A $H_2O_2/CH_3COOH$ mixture is highly selective towards $Si_{1-x}Ge_x$ over Si with improved smoothness; however, this chemistry is not as effective at removing silicon-germanium on vertical stacks and is not compatible with nitride/oxide masks.

Accordingly, there is a need in the art for a silicon-germanium etchant composition and method for using the composition in forming, for example, Si nanowire channels in GAA MOSFETs, which provides better control of the etching process during removal of sacrificial SiGe layers that does not suffer from the above-mentioned drawbacks.

BRIEF SUMMARY OF THE INVENTION

In one aspect, the present invention provides an etching solution suitable for the selective removal of silicon-germanium over silicon from a microelectronic device, which comprises: water; oxidizer; water-miscible organic solvent; fluoride ion source; and optionally surfactant.

The compositions of this invention may comprise from about 30 to 90% by weight water; from about 0.5 to about 20% by weight oxidizer; from about 5 to about 75% by weight water-miscible organic solvent; from about 0.001 to 20% by weight of fluoride ion source; and optionally surfactant. Alternatively, the compositions of this invention may comprise from about 40 to 80% by weight water; from about 0.5 to about 10% by weight oxidizer; from about 10 to about 70% by weight water-miscible organic solvent; and from about 0.01 to about 10% fluoride ion source; and optionally surfactant. Alternatively, the compositions of this invention may comprise these and other components in any of the amounts described below in any combination of the amounts described below.

In another aspect of this invention the compositions of this invention further comprise a buffer composition.

In another aspect of this invention any of the compositions of this invention further comprise a polyfunctional acid and its conjugate base as a buffer composition.

In another aspect, the present invention provides a method of selectively enhancing the etch rate of silicon-germanium relative to silicon on a microelectronic (compositesemiconductor) device comprising silicon and silicon-germanium, the method comprising the steps of: contacting the mocroelectronic (composite semiconductor) device comprising silicon and silicon-germanium with an aqueous composition comprising: water; oxidizer; water-miscible organic solvent; fluoride ion source; and optionally, surfactant; and rinsing the microelectronic (composite semiconductor) device after the silicon-germanium is at least partially removed, wherein the selectivity of the etch for silicon-germanium over silicon is or greater than about 5, or greater than about 10, or greater than about 20, or greater than about 20, or greater than about 25, or greater than about 30, or greater than about 80. The method conditions, such as time and temperature, may be increased or decreased to achieve the desired selectivity and removal rates. Alternatively, the contacting step comprises any of the compositions of this invention.

The embodiments of the invention can be used alone or in combinations with each other.

BRIEF DESCRIPTION OF DRAWINGS

FIG. 1 is a schematic of a portion of microelectronic device prior to and after etching with the compositions and methods of this invention to selectively remove silicon germanium alloy from the device.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of".

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of silicon-germanium over silicon from a microelectronic device having such material(s) thereon during its manufacture.

It will be understood that the term "silicon" as deposited as a material on a microelectronic device will include polysilicon.

For ease of reference, "microelectronic device" or "semiconductor device" corresponds to semiconductor substrates (e.g. wafers), flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

A "composite semiconductor device" or "composite microelectronic device" means that the device has more than one materials and/or layers and/or portions of layers present on a non-conductive substrate. The materials may comprise high K dielectrics, and/or low K dielectrics and/or barrier materials and/or capping materials and/or metal layers and/or others known to persons of skill.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-K dielectric material" refers to a material with a high dielectric constant K (as compared to silicon dioxide). High-K dielectrics may be used to replace a silicon dioxide gate dielectric or another dielectric layer of a microelectronic device. The high-k material may be hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), or platinum zirconium titanium (PZT).

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all percentages of the components are weight percentages and are based on the total weight of the composition, that is, 100%.

In the broad practice of this aspect, the etching solution of the present development comprises, consists essentially of, or consists of water; an oxidizer; a water-miscible organic solvent; a fluoride ion source; and optionally, a surfactant.

In some embodiments, the etching solution compositions disclosed herein are formulated to be substantially free or free of inorganic bases and/or quaternary ammonium compounds, that may include quaternary ammonium fluorides and/or quaternary ammonium hydroxides, for examples the composition may be free of one or more of the following: tetramethylammonium fluoride, tetraethylammonium fluoride, methyltriethylammonium fluoride, and tetrabutylammonium fluoride, tetramethylammonium hydroxide, tetraethylammonium hydroxide, methyltriethylammonium hydroxide, and/or tetrabutylammonium hydroxide.

The headings employed herein are not intended to be limiting; rather, they are included for organizational purposes only.

Water

The etching compositions of the present development are aqueous-based and, thus, comprise water. In the present invention, water functions in various ways, such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water. The ranges of water described in the next paragraph include all of the water in the composition from any source. It is believed that, for most applications, the weight percent of water in the composition will be present in a range with start and end points selected from the following group of numbers: 0.5, 1, 5, 10, 15, 20, 25, 30, 40, 45, 50, 55, 60, 65, 70, 75, 80, 85 and 90. Examples of the ranges of water that may be used in the composition include, for examples, from about 0.5% to about 90% by wt., or 1% to about 85% by wt. of water; or from about 5.0% to about 80% by wt., or from about 10% to about 70% by wt., or from about 40% to about 80% by wt. of water. Still other preferred embodiments of the present invention may include water in an amount to achieve the desired weight percent of the other ingredients.

Oxidizer

The etching compositions of the present invention comprise an oxidizing agent, also referred to as an "oxidizer." The oxidizer functions primarily to etch silicon-germanium alloy by forming a corresponding oxide (i.e., germanium or silicon). The oxidizing agent can be any suitable oxidizing agent. Suitable oxidizing agents include, but are not limited to, one or more peroxy-compounds, i.e., compounds that comprise at least one peroxy group (—O—O—). Suitable peroxy-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., iodates, periodates, and acids thereof, and mixtures thereof, and the like), perboric acid, perborates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like.

In some embodiments, oxidizing agents include, but are not limited to, hydrogen peroxide, periodic acid, potassium iodate, potassium permanganate, ammonium persulfate, ammonium molybdate, ferric nitrate, nitric acid, potassium nitrate, ammonia, and mixtures thereof. In still other embodiments, oxidizing agents include hydrogen peroxide and urea-hydrogen peroxide. In some embodiments, the oxidizing agent is hydrogen peroxide.

In some embodiments, the amount of oxidizer in the composition will be in a range with start and end points selected from the following group of numbers: 0.5, 1, 1.5, 2, 2.5, 3, 5, 8, 10, 12, 15, 20, 25, 30, 40, 45 and 50. In some embodiments, the oxidizer will be present in the composition of this invention in an amount from about 0.5% to about 50% by weight, or from about 0.5% to about 25% by weight, or from about 1.5% to about 15% by weight, or from 3.0% to about 10% by weight, or from 3% to about 5% by weight or from 1% to about 10% by weight, or from 1% to about 8% by weight, or from 1% to about 5% by weight of the composition.

Fluoride Ion Source

The etching compositions of the present disclosure also comprises one or more sources of fluoride ion. Fluoride ion functions principally to assist in removal of silicon or germanium oxide that has formed upon action of the oxidizer. Typical compounds that provide a fluoride ion source according to the present invention are hydrofluoric acid, ammonium fluoride, quaternary ammonium fluorides, fluoroborates, fluoroboric acid, tetrabutylammonium tetrafluoroborate, aluminum hexafluoride, and a fluoride salt of an aliphatic primary, secondary or tertiary amine having the formula:

$$R^1NR^2R^3R^4F,$$

wherein $R^1$, $R^2$, $R^3$ and $R^4$ individually represent H or a $(C_1$-$C_4)$alkyl group. Typically, the total number of carbon atoms in the $R^1$, $R^2$, $R^3$ and $R^4$ groups is 12 carbon atoms or less. Examples of fluoride salts of an aliphatic primary, secondary or tertiary amine such as, for example, tetramethylammonium fluoride, tetraethylammonium fluoride, methyltriethylammonium fluoride, and tetrabutylammonium fluoride.

In selecting the source of the fluoride ion, consideration should be given as to whether or not the source releases ions that would adversely affect the surface being cleaned. For example, in cleaning semiconductor elements, the presence of sodium or calcium ions in the cleaning composition can have an adverse effect on the surface of the element. In some embodiments, the fluoride ion source is ammonium fluoride or ammonium bifluoride.

It is believed that the amount of the compound used as the source of the fluoride ion in the cleaning composition will, for most applications, comprise, about 0.01 to about 8% by weight or from about 0.01 to about 20% by weight of a solution 40% ammonium fluoride, or stoichiometric equivalent thereof. Preferably, the compound comprises from about 0.02 to about 8% by weight, more preferably from about 0.02 to about 6% by weight, still more preferably, about 1 to about 8% by weight, and most preferably, from about 0.025% to about 5% by weight of a solution of about 40% ammonium fluoride. In some embodiments, the composition will comprise about 0.01 to about 8% by weight or about 0.01 to about 7% by weight of a fluoride ion source, which may be provided by a 40% ammonium fluoride solution. Preferably, the compound comprises from about 0.02 to about 6% by weight of a fluoride ion source and, most preferably, from about 0.025% to about 5% or from about 0.04 to about 2.5% by weight of a fluoride ion source or from about 0.05 to about 15% by weight of a solution of 40% ammonium fluoride, most preferably, from about 0.0625% to about 12.5% or from about 0.1 to about 6.25% by weight of a solution of 40% ammonium fluoride. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

For the purposes of clarity, the amount of the source of the fluoride ion in the cleaning composition, based on the addition of the fluoride ion source only (neat), may comprise, a weight percent in range having start and end points selected from the following list of weight percents: 0.001, 0.0016, 0.002, 0.0025, 0.004, 0.008, 0.01, 0.02, 0.025, 0.04, 0.05, 0.1, 0.4, 0.6, 1, 2, 2.4, 2.5, 2.8, 3.2, 5, 6, 10, 12, 15, and 20. For examples the amount of fluoride ion source (neat) in the composition may be from about 0.004 to about 3.2% by weight or from about 0.004 to about 2.8% by weight. The composition may comprises from about 0.008 to about 3.2% by weight, or from about 0.008 to about 2.4% by weight, or about 0.4 to about 3.2% by weight, or from about 0.01% to about 2% by weight, or 0.01% to about 10% by weight, or 0.01% to about 5% by weight of a fluoride ion source. In some embodiments, the composition will comprise about 0.004 to about 3.2% by weight of a fluoride ion source. The composition may comprise fluoride ion source or from about 0.001% to about 2% or from about 0.0016 to about 1% by weight of a fluoride ion source or from about 0.002 to about 6% by weight, or from about 0.0025% to about 5% or from about 0.04 to about 0.025% by weight. In yet other embodiments, the composition may comprise about 0.05 to about 20% by weight or about 0.1 to about 15%, or from about 0.1 to about 20, or from about 0.01 to about 20, or about 0.1 to about 10% or about 0.1 to about 5%, or from about 0.6 to about 12% or from about 1% to about 20% or from about 1 to about 15% or from about 1 to about 10% by weight % by weight of a fluoride ion source based on a neat fluoride ion source.

Water-Miscible Solvent

The etching compositions of the present invention comprise a water-miscible solvent. Examples of water-miscible organic solvents that can be employed are ethylene glycol, propylene glycol, butyl diglycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylsulfoxide, tetrahydrofurfuryl alcohol, glycerol, alcohols, sulfoxides, sulfolane or mixtures thereof. Preferred solvents may be alcohols, diols, or mixtures thereof. In some embodiments the preferred solvents may be sulfolane or sulfoxides, such as dimethylsulfoxide. In some embodiments, the preferred solvents are diols such as, for example, propylene glycol. In other embodiments the preferred solvents are glycol ethers.

In some embodiments of the present invention, the water-miscible organic solvent may comprise a glycol ether. Examples of glycol ethers include butyl diglycol, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether (DPM), dipropylene glycol monopropyl ether, dipropylene glycol monoisopropyl ether, dipropylene monobutyl ether, diproplyene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

In some embodiments, the water miscible organic solvent in the composition of this invention may comprise glycol ethers, such as, butyl diglycol or dipropylene glycol monomethyl ether. In some embodiments, the preferred solvents may be alcohols, diols, or mixtures thereof. In some embodiments, the preferred solvents are diols such as, for example, propylene glycol. In other embodiments the preferred solvents are glycol ethers, such as dibutyl glycol. In some embodiments the preferred solvents may be sulfolane or sulfoxides, such as dimethylsulfoxide. Mixtures of these and other solvents may be used.

It is believed that, for most applications, the amount of water-miscible organic solvent in the composition may be in a range having start and end points selected from the following list of weight percents: 0.5, 1, 5, 7, 10, 12, 15, 20, 25, 30, 35, 40, 45, 50, 55, 59.5, 60, 65, 70, 75 and 80. Examples of such ranges of solvent include from about 0.5% to about 59.5% by weight; or from about 1% to about 50% by weight; or from about 1% to about 40% by weight; or from about 0.5% to about 30% by weight; or from about 1% to about 30% by weight; or from about 5% to about 30% by weight; or from about 5% to about 15% by weight; or from about 7% to about 12% by weight or from about 7% to about 80% by weight, or from about 20% to about 60% by weight, or from about 10% to about 50% by weight, or from about 10% to about 45% by weight, or from about 10% to about 35% by weight, or from about 15% to about 50% by weight, or from about 15% to about 35% by weight of the composition.

Surfactants (Optional)

The etching compositions of the present invention optionally comprise at least one surfactant. The surfactant functions to protect the silicon from etching. Surfactants for use in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31 R1, Pluronic L61, Pluronic F-127), polyoxypropylene sucrose ether (SN0085, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100).

Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl) pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel).

In some embodiments, the cationic surfactant, if employed, comprises polyalkyleneimine. Preferably, the polyalkyleneimine is a polyethyleneimine (PEI). Any PEI may be used, but it is preferred that a homopolymeric polyethyleneimine is employed. The PEI may be branched or linear, but preferably it is branched.

While it has been found that the PEI used may have any formula weight for effectiveness, preferably the PEI has a lower formula weight (FW). In an embodiment, the PEI has a FW between 100 and 50,000, between 400 and 25,000, between 800 and 10,000, or between 1000 and 3000.

In an embodiment, the polyalkyleneimine comprises a polyethyleneimine (PEI) and preferably the PEI comprises less than 1% by weight of the composition, preferably less than 0.5% by weight, or less than 0.25% by weight or from about 0.1% to about 1% by weight of the composition. Preferably the PEI has a molecular weight between 100 and 2500, preferably 200 and 1500 and most preferably between 400 and 1200.

In a preferred embodiment, the polyalkyleneimine has a molecular weight between 100 and 2500, between 200 and 1500, between 400 and 1200, or between 700 and 900. A molecular weight of 800 is particularly suitable. The molecular weight is suitably determined by light scattering techniques known in the art.

Polyethyleneimines are commercially available, for example Lupasol® 800 which is supplied by BASF.

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly (acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant comprises dodecylbenzene sulfonic acid, dodecyl phosphonic acid, dodecyl phosphate, TRITON X-100, SOKALAN CP10S, PEG 400, and PLURONIC F-127.

In some embodiments, mixtures of surfactants may be used in the compositions of this invention. For example, in some of the compositions of this invention, the surfactants may comprise mixtures of acetylenic diols or modified acetylenic diols and polyalkyleneimine.

When present, the total amount of surfactant may be in a range from about 0.001 wt % to about 1 wt %, preferably about 0.1 wt % to about 1 wt %, based on the total weight of the composition. Alternatively, it is believed that for some applications, if present, the one or more surfactants will comprise from about 0.1 wt. % to about 15 wt. % of the composition; or from about 0.1 wt. % to about 10 wt. %, or from about 0.5 wt. % to about 5 wt. %, or from about 0.1 wt. % to about 1 wt. %, or about 0.5 wt. % to about 5 wt. % of the composition. In alternative embodiments the weight percent of surfactant in the composition, based on the total weight of the composition may be within any range having start and end points selected from the following: 0.1, 0.2, 0.5, 0.9, 1, 1.5, 2, 4, 5, 8, 10, 12 and 15.

In some embodiments the compositions of this invention will be free of or substantially free of any or all of the above-listed surfactants.

Buffer (Optional)

The etching compositions optionally include a buffer composition. Typically, the buffer composition comprises, consists essentially of, or consists of an amine compound and a polyfunctional organic acid as detailed below.

Amine Compound (Buffer) (Optional)

In some embodiments, the optional buffer composition of the etching compositions of the present disclosure comprise a secondary or tertiary organic amine. The secondary or tertiary organic amine functions primarily to provide the conjugate base component of the buffer.

Examples of secondary or tertiary organic amine compounds for use as a buffer component in certain preferred embodiments of the present disclosure, include the alkanolamines. Preferred alkanolamines include the lower alkanolamines which are secondary and/or tertiary having from 1 to 5 carbon atoms. Examples of such alkanolamines include diethanolamine, di- and triisopropanolamine, 2-(2-aminoethylamino)ethanol, 2-(2-aminoethoxy)ethanol (AEE), triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the amine compound is an alkanolamine selected from the group consisting of triethanolamine (TEA), diethanolamine, N-methyl diethanolamine, diisopropanolamine, N-methyl ethanol amine, 2-(2-aminoethoxy)ethanol (AEE), and mixtures thereof.

It is believed that the amount of the amine compound in the composition will, for the most applications, comprise a percent weight, based on the total weight of the composition within any range having start and end points selected from the following: 0.1, 0.2, 0.5, 0.6, 0.9, 1, 1.5, 2, 3, 4, 5, 8, 10, 12, 15, 20, and 30, for examples, from about 10% to about 30% by weight of the composition, or from about 20% to about 30% or from about 0.5% to about 10%, or from about 0.6% to about 5%, or from about 0.5% to about 8% or from about 0.5% to about 3 by weight of the composition.

2-methylpropane-1,2,3-triscarboxylic, benzene-1,2,3-tricarboxylic [hemimellitic], propane-1,2,3-tricarboxylic [tricarballylic], 1,cis-2,3-propenetricarboxylic acid [aconitic], and the like), tetracarboxylic acids (e.g., butane-1,2,3,4-tetracarboxylic, cyclopentanetetra-1,2,3,4-carboxylic, benzene-1, 2,4,5-tetracarboxylic [pyromellitic], and the like), pentacarboxlyic acids (e.g., benzenepentacarboxylic), and hexacarboxylic acids (e.g., benzenehexacarboxylic [mellitic]), and the like. The respective pKa values of these acids are provided in Table 1. Particularly preferred polyprotic acids include tricarboxylic acids, with citric acid being most preferred.

TABLE 1

| Acid | pKa value at 25° C. | | | | | |
| --- | --- | --- | --- | --- | --- | --- |
| | pK1 | pK2 | pK3 | pK4 | pK5 | pK6 |
| Citric acid | 3.13 | 4.76 | 6.40 | | | |
| 2-Methylpropane-1,2,3-triscarboxylic | 3.53 | 5.02 | 7.20 | | | |
| Benzene-1,2,3-tricarboxylic (hemimellitic) | 2.98 | 4.25 | 5.87 | | | |
| Propane-1,2,3-tricarboxylic (tricarballylic) | 3.67 | 4.84 | 6.20 | | | |
| 1,cis-2,3-Propenetricarboxylic acid, (aconitic) | 3.04 | 4.25 | 5.89 | | | |
| Butane-1,2,3,4-tetracarboxylic | 3.36 | 4.38 | 5.45 | 6.63 | | |
| Cyclopentanetetra-1,2,3,4-carboxylic | 3.07 | 4.48 | 5.57 | 10.06 | | |
| Benzene-1,2,4,5-tetracarboxylic (pyromellitic) | 2.43 | 3.13 | 4.44 | 5.61 | | |
| Benzenepentacarboxylic | 2.34 | 2.95 | 3.94 | 5.07 | 6.25 | |
| Benzenehexacarboxylic (mellitic) | 2.08 | 2.46 | 3.24 | 4.44 | 5.50 | 6.59 |

Preferably, the amine compound has a pKa<9.0.

Polyfunctional Organic Acid (Buffer Component)

In some embodiments, the optional buffer composition of the etching compositions of the present disclosure comprise one or more polyfunctional organic acids, which function primarily as the conjugate acid portion of the buffer. As used herein, the term "polyfunctional organic acid" refers to an acid or a multi-acid that has more than one carboxylate group, including but not limited to, (i) dicarboxylate acids (such as malonic acid, malic acid, et al); dicarboxylic acids with aromatic moieties (such as phthalic acid et al), and combinations thereof; and (ii) tricarboxylic acids (such as citric acid et al), tricarboxylic acids with aromatic moieties (such as trimellitic acid, et al), and combinations thereof.

Useful dicarboxylic acids include oxalic acid, malonic acid, succinic acid, glutaric acid, adipic acid, pimelic acid, suberic acid, azelaic acid and sebacic acid.

In some embodiments, the preferred acids for the buffer system are polyprotic that have at least three carboxylic acid groups. Such acids have at least a second and a third dissociation constant, each of which is higher relative to its respective preceding constant. This indicates that the acid loses a first proton more easily than a second one, because the first proton separates from an ion of a single negative charge, whereas the second proton separates from the ion of a double negative charge. It is believed that the double negative charge strongly attracts the proton back to the acid ion. A similar relationship exists between the second and third separated protons. Thus, polyprotic acids such as, for example, those having at least three carboxylic acid groups are useful in controlling the pH of a solution, particularly at a pH corresponding to their higher pKa value. Therefore, in addition to having a pKa value of about 5 to about 7, preferred polyprotic acids of the present invention have multiple pKa values, wherein the highest pKa is from about 5 to about 7.

Polyprotic acids having at least three carboxylic acid groups according to the present invention are highly compatible with polyhydric solvents. Examples of preferred polyprotic acids include tricarboxylic acids (e.g., citric acid, Citric acid, the preferred polyprotic acid, is a tricarboxylic acid having three pKa values: 3.13, 4.76, and 6.40, corresponding to trihydrogencitrate ions, dihydrogencitrate ions, and monohydrogen citrate ions, respectively. In certain preferred embodiments of the present invention, the buffer system comprises a salt of citric acid, with especially preferred buffers comprising aqueous solutions of ammonium citrate tribasic (TAC) and citric acid.

In alternative embodiments, other polyfunctional organic acids (as just-described for citric acid) may be used in the compositions of the invention, with their respective salts, commonly ammonium salts of the respective polyfunctional acids, for examples, malonic acid and malonic acid, ammonium salt; oxalic acid and ammonium oxalate; and succinic acid and ammonium succinate; and so forth.

It is believed that the amount of polyfunctional organic acid in the compositions of this invention will be in a percent weight, based on the total weight of the composition, within any range having start and end points selected from the following: 0.1, 0.25, 0.4, 0.5, 0.6, 0.8, 0.9, 1, 1.5, 2, 3, 4 and 5, for examples, from about 10% to about 30% by weight of the composition, or from about 20% to about 30% or from about 0.5% to about 10%, or from about 0.6% to about 5%, or from about 0.5% to about 8% or from about 0.5% to about 3 by weight of the about 0.1 wt % to 5 wt %, preferably from 0.25 wt % to 3 wt %, and more preferably from 0.5 wt % to 2.0 wt %.

For examples, the conjugate base may be present in the composition in a percent weight, based on the total weight of the composition within any range having start and end points selected from the following: 0.1, 0.25, 0.4, 0.5, 0.6, 0.8, 0.9, 1, 1.5, 2, 3, 4 and 5, for examples, from about 10% to about 30% by weight of the composition, or from about 20% to about 30% or from about 0.5% to about 10%, or from about 0.6% to about 5%, or from about 0.5% to about 8% or from about 0.5% to about 3 by weight of the about 0.1 wt % to 5 wt %, preferably from 0.25 wt % to 3 wt %, and more preferably from 0.5 wt % to 2.0 wt %. In some embodiments, if the conjugate base (such as the ammonium salt) to the polyfunctional acid is present in the composition, it may be present in a 10:1 to 1:10 weight ratio, or 5:1 to 1:5 weight ratio based on the amount of the polyfunctional acid present in the composition.

Preferably, the buffer composition of the disclosed etching compositions buffer the compositions so they are acidic. In some embodiments, the pH is from about 2 to about 7 or from about 4 to about 6.5.

Other Optional Ingredients

The etching composition of the present invention may also include one or more of the following additives: chelating agents, chemical modifiers, dyes, biocides, and other additives. The additive(s) may be added to the extent that they do not adversely affect the performance of the composition.

Another optional ingredient that can be used in the etching composition is a metal chelating agent; it can function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that the chelating agent, if present, will be in the composition in an amount of from about 0.1 wt. % to about 10 wt. %, preferably in an amount of from about 0.5 wt. % to about 5 wt. % of the composition.

In some embodiments the compositions of this invention will be free of or substantially free of any or all of the above-listed chelating agents added to the composition.

Other commonly known components such as dyes, biocides etc. can be included in the cleaning composition in conventional amounts, for example, amounts up to a total of about 5 weight % of the composition.

In some embodiments, the composition may be substantially free of or free of one or more of the following: hydroxides, metal hydroxides, such as KOH or LiOH or NaOH. In other embodiments, the composition may be substantially free of or free of a halide-containing compound other than one or more fluorine-containing compounds, for example it may be substantially free or free of one or more of the following: bromine-, chlorine- or iodine-containing compounds. In other embodiments, the composition may be substantially free or free of sulfonic acid and/or phosphoric acid and/or sulfuric acid and/or nitric acid and/or hydrochloric acid. In other embodiments, the composition may be substantially free or free of sulfates and/or nitrates and/or sulfites and/or nitrites. In other embodiments, the composition may be substantially free or free of: ammonium hydroxide and/or ethyl diamine. In other embodiments, the composition may be substantially free or free of: sodium-containing compounds and/or calcium-containing compounds and/or manganese-containing compounds or magnesium-containing compounds and/or chromium-containing compounds and/or sulfur-containing compounds.

Other commonly known components such as dyes, biocides etc. can be included in the cleaning composition in conventional amounts, for example, amounts up to a total of about 5 weight % of the composition.

The etching solution composition of the present invention is typically prepared by mixing the components together in a vessel at room temperature until all solids have dissolved in the aqueous-based medium.

Method

In another aspect there is provided a method of selectively enhancing the etch rate of silicon-germanium relative to silicon on a microelectronic (composite semiconductor) device comprising silicon and silicon-germanium, the method comprising the steps of: contacting the microelectronic (composite semiconductor) device comprising silicon and silicon-germanium with an aqueous composition comprising: water; an oxidizer; a water-miscible organic solvent; a fluoride ion source; and optionally a surfactant; and rinsing the microelectronic (composite semiconductor) device after the silicon-germanium is at least partially removed, wherein the selectivity of the etch for silicon-germanium over silicon is greater than about 5, or 10 or 15 or 20 or 25 or 30 or 65 or 80. In some embodiments, the etch selectivity for silicon-germanium over silicon is from, for example, a horizontal stack as shown in FIG. 1 having a plurality (more than one) of alternating SiGe and Si layers. An additional drying step may also be included in the method. "At least partially removed" means removal of at least 50% of the material, preferably at least 80% removal. Most preferably, 100% removal of silicon-germanium is achieved using the compositions of the present development.

The contacting step can be carried out by any suitable means such as, for example, immersion, spray, or via a single wafer process. The temperature of the composition during the contacting step is preferably from about 25 to about 100° C. and more preferably from about 30 to about 50° C. The contacting time may be from 1 minute to 60 minutes.

Compositions of the present invention preferably exhibit the following performance characteristics: etch rate selectivity on SiGe/Si greater than (>) 5 or 10 or 20 or greater than 30 or greater than 50, SiN less than (<) 8 or 5 Å/min and thermal oxide (silicon oxide) less than (<) 5 or 2 or 1 Å/min. In some embodiments, the selectivity of the etch for silicon nitride over silicon oxide may be between about 125 and about 500.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water followed by the other components in no particular order. Typically, the oxidizer (e.g., hydrogen peroxide) is added just prior to use.

Compositions of the Substrate

SiGe/Si multilayers were deposited by hetero-epitaxy on Si wafer. Side A of FIG. 1 shows the microelectronic device treated in the examples. The SiGe/Si multilayer deposition started with a thick SiGe layer 12 on the Si substrate 10. Then followed by a Si/SiGe multilayer deposition. (The Si layers are shown labeled 14 and the SiGe layers are shown labeled 16.) An oxide layer 18 and nitride hard mask (HM) layer 20 were deposited on top of the Si/Ge (and oxide) multilayer and patterned into parallel FINs 22. The SiGe/Si nanowire FINs were etched selectively and resulted in Si nanowire. Side A of the FIGURE shows the microelectronic device prior to etching and side B of the FIGURE shows the microelectronic device after etching.

Processing Conditions

Etching tests were run using 100 g of the etching compositions in a 250 ml beaker with a ½" round Teflon stir bar set at 400 rpm. The etching compositions were heated to a temperature of about 45° C. on a hot plate. The test coupons were immersed in the compositions for about 20 minutes while stirring.

The segments were then rinsed for 3 minutes in a DI water bath or spray and subsequently dried using filtered nitrogen. The silicon and silicon-germanium etch rates were estimated from changes in the thickness before and after etching and was measured by spectroscopic ellipsometry (MG-1000, Nano-View Co., Ltd., South Korea We use SCI FilmTek SE2000). Typical starting layer thickness was 1000 Å for Si and 1000 Å for SiGe.

Example Set 1

Example 1

This example shows that 2.0 wt. % of hydrogen peroxide has an effect on the etch rate of SiGe.

TABLE 2

Effect of $H_2O_2$ on SiGe Etch.

| | 284A | 284C |
|---|---|---|
| $H_2O_2$ | 2 | 0 |
| Triammonium citrate | 1 | 1 |
| DIW | 51.3 | 53.3 |
| Ammonium bifluoride | 0.5 | 0.5 |
| DMSO | 45 | 45 |
| Lupasol 800 | 0.2 | 0.2 |
| SiGe e/r 40° C. | 30.68 | 5.59 |

Example 2

This example shows that adding a fluoride source has an effect on the etch rate of SiGe in the presence of hydrogen peroxide.

TABLE 3

The Role of Fluoride in Etching SiGe.

| | 291I | 291J |
|---|---|---|
| $H_2O_2$ | 3 | 3 |
| Triammonium citrate | 2 | 2 |
| Citric acid | 1 | 1 |

TABLE 3-continued

The Role of Fluoride in Etching SiGe.

| | 291I | 291J |
|---|---|---|
| DIW | 33.4 | 33.8 |
| Ammonium bifluoride | 0.4 | 0 |
| DMSO | 30 | 30 |
| PG | 30 | 30 |
| Lupasol 800 | 0.2 | 0.2 |
| SiGe e/r 45° C. | 29.33 | 1 |

Example 3

The following compositions were prepared to determine the effect on selectivity of certain solvent. Butyl diglycol (BDG) exhibited promise as a solvent that could enhance the SiGe etch rate.

TABLE 4

The Impact of Different Solvents on Etch Rates.

| | 290B | 290J | 290K | 290L | 290M | 290N | 290O |
|---|---|---|---|---|---|---|---|
| H2O2 (30%) | 10 | 10 | 10 | 10 | 10 | 10 | 10 |
| TAC | 0.6 | 0.6 | 0.6 | 0.6 | 0.6 | 0.6 | 0.6 |
| Citric acid | 0.5 | 0.5 | 0.5 | 0.5 | 0.5 | 0.5 | 0.5 |
| DIW | 65.3 | 65.3 | 65.3 | 65.3 | 65.3 | 65.3 | 65.3 |
| NH4F(40%) | 3 | 3 | 3 | 3 | 3 | 3 | 3 |
| AEE | 0.6 | 0.6 | 0.6 | 0.6 | 0.6 | 0.6 | 0.6 |
| DPM | 20 | | | | | | |
| BDG | | 20 | | | | | |
| Glycerol | | | 20 | | | | |
| PG | | | | 20 | | | |
| DMSO | | | | | 20 | | |
| Sulfolane | | | | | | 20 | |
| DIW | | | | | | | 20 |
| poly Si e/r @ 45 C. | 4.51 | 3.77 | 11.89 | 3.96 | 14.54 | 4.4 | 4 |
| SiGe e/r @ 45 C. | 46.23 | 58.23 | 40.42 | 38.4 | 33.24 | 44.6 | 28.6 |
| SiGe/poly Si | 10.25 | 15.45 | 3.40 | 9.70 | 2.29 | 10.14 | 7.15 |

Example 4

The following example evaluates corrosion inhibitors to suppress silicon etching. The PEI Lupasol® 800 contributes to the improvement in the desired selectivity.

TABLE 5

Lupasol ® Effect on Etch Rates.

| | 290J | 290U |
|---|---|---|
| H2O2 (30%) | 10 | 10 |
| TAC | 0.6 | 0.6 |
| Citric acid | 0.5 | 0.5 |
| DIW | 65.3 | 65.65 |
| NH4F (40%) | 3 | 3 |
| AEE | 0.6 | |
| lupasol 800 | | 0.25 |
| BDG | 20 | 20 |
| Poly Si e/r @ 45 C. | 3.8 | 2.4 |
| SiGe (25%) e/r @ 45 C. | 58.2 | 87.0 |
| Selectivity (SiGe/Si) | 15.4 | 36.7 |

Example 5

The following example evaluates corrosion inhibitors to suppress silicon etching. The non-ionic surfactant Surfynol® 485 aids in the suppression of poly Si etch rate.

TABLE 6

Surfynol ® Effect on Suppressing Poly Si Etch Rate.

|  | 298U | 298U1 |
|---|---|---|
| H2O2 (30%) | 10 | 10 |
| Citric acid | 0.5 | 0.5 |
| DIW | 57.65 | 57.15 |
| lupasol 800 | 0.35 | 0.35 |
| BDG | 30 | 30 |
| NH4F (40%) | 1.5 | 1.5 |
| surfynol 485 |  | 0.5 |
| Poly Si e/r @ 40 C. | 4.13 | 1.1 |
| SiGe (25%) e/r @ 40 C. | 79.12 | 76.22 |
| Selectivity (SiGe/Si) | 19.2 | 69.3 |

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of silicon-germanium over silicon from a microelectronic device, which comprises:
   water;
   hydrogen peroxide;
   a glycol ether solvent;
   a fluoride ion source; and
   a surfactant selected from the group consisting of a polyalkyleneimine, an acetylenic diol, a modified acetylenic diol, and mixtures thereof.

2. The etching composition of claim 1 wherein the glycol ether solvent is selected from the group consisting of butyl diglycol, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether (DPM), dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

3. The etching composition of claim 2 wherein the glycol ether solvent is butyl diglycol.

4. The etching composition of claim 1 wherein the surfactant is polyalkyleneimine and the polyalkyleneimine is polyethyleneimine.

5. The etching composition of claim 1 wherein the fluoride ion source is selected from the group consisting of hydrofluoric acid, ammonium fluoride, ammonium bifluoride, quaternary ammonium fluorides, fluoroborates, fluoroboric acid, tetrabutylammonium tetrafluoroborate, aluminum hexafluoride, and a fluoride salt of an aliphatic primary, secondary or tertiary amine having the formula:

$$R^1NR^2R^3R^4F,$$

wherein $R^1$, $R^2$, $R^3$ and $R^4$ individually represent H or a $(C_1\text{-}C_4)$ alkyl group.

6. The etching composition of claim 5 wherein the fluoride ion source is selected from the group consisting of ammonium fluoride, ammonium bifluoride, tetramethylammonium fluoride, tetraethylammonium fluoride, methyltriethylammonium fluoride, and tetrabutylammonium fluoride.

7. The etching composition of claim 5 wherein said fluoride ion source comprises ammonium fluoride or ammonium bifluoride.

8. The etching composition of claim 1 further comprising a buffer composition.

9. The etching composition of claim 8, wherein the buffer composition comprises an amine compound and a polyfunctional organic acid.

10. The etching composition of claim 9, wherein the amine compound comprises alkanolamine and the polyfunctional organic acid comprises polyprotic acids having at least three carboxylic acid groups.

11. The etching composition of claim 10, wherein the alkanolamine is selected from the group consisting of diethanolamine, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

12. The etching composition of claim 10, wherein the polyprotic acid is selected from the group consisting of citric acid, 2-methylpropane-1,2,3-triscarboxylic, benzene-1,2,3-tricarboxylic [hemimellitic], propane-1,2,3-tricarboxylic [tricarballylic], 1,cis-2,3-propenetricarboxylic acid [aconitic], e.g., butane-1,2,3,4-tetracarboxylic, cyclopentanetetra-1,2,3,4-carboxylic, benzene-1,2,4,5-tetracarboxylic [pyromellitic], benzenepentacarboxylic, and benzenehexacarboxylic [mellitic], and mixtures thereof.

13. The etching composition of claim 8, wherein the buffer composition comprises an ammonium compound and a polyfunctional organic acid.

14. A method of selectively enhancing the etch rate of silicon-germanium relative to silicon on a microelectronic device comprising silicon and silicon-germanium, the method comprising the steps of:
   contacting the microelectronic device comprising silicon and silicon-germanium with an aqueous composition comprising: water; hydrogen peroxide; a glycol ether solvent; a fluoride ion source; and a surfactant selected from the group consisting of a polyalkyleneimine, an acetylenic diol, a modified acetylenic diol, and mixtures thereof; and
   rinsing the microelectronic device after the silicon-germanium is at least partially removed, wherein the selectivity of the etch for silicon-germanium over silicon is greater than about 10.

15. The method of claim 14 further comprising the step of drying the semiconductor device.

16. The method of claim 14 wherein the selectivity of the etch for silicon-germanium over silicon is greater than 10.

17. The method of claim 14 wherein the contacting step is performed at a temperature of from about 25° C. to about 100° C.

18. The method of claim 14 wherein the water-miscible solvent is butyl diglycol.

19. The method of claim 14 wherein the surfactant is selected from the group consisting of an acetylenic diol, a modified acetylenic diol, and mixtures thereof.

20. The method of claim 14 wherein the surfactant comprises polyalkyleneimine.

21. The method of claim 14 wherein the fluoride ion source is selected from the group consisting of hydrofluoric acid, ammonium fluoride, quaternary ammonium fluorides such as, for example, fluoroborates, fluoroboric acid, tetrabutylammonium tetrafluoroborate, aluminum hexafluoride, and a fluoride salt of an aliphatic primary, secondary or tertiary amine having the formula:

$$R^1NR^2R^3R^4F,$$

wherein $R^1$, $R^2$, $R^3$ and $R^4$ individually represent H or a $(C_1\text{-}C_4)$ alkyl group.

22. The method of claim 21 wherein the fluoride ion source is selected from the group consisting of ammonium fluoride, ammonium bifluoride, tetramethylammonium fluoride, tetraethylammonium fluoride, methyltriethylammonium fluoride, and tetrabutylammonium fluoride.

\* \* \* \* \*